United States Patent
Walther et al.

(10) Patent No.: US 7,544,957 B2
(45) Date of Patent: Jun. 9, 2009

(54) NON-UNIFORM ION IMPLANTATION

(75) Inventors: Steven R. Walther, Andover, MA (US); Sandeep Mehta, Boxford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 421 days.

(21) Appl. No.: 11/441,633

(22) Filed: May 26, 2006

(65) Prior Publication Data

US 2008/0067434 A1    Mar. 20, 2008

(51) Int. Cl.
*H01J 37/08* (2006.01)
*G21K 5/10* (2006.01)

(52) U.S. Cl. ............... 250/492.21; 250/492.2; 250/396 R; 250/396 ML; 250/252.1; 250/442.11; 250/398; 427/523; 438/527; 315/111.81; 118/729; 118/722

(58) Field of Classification Search ............ 250/492.21, 250/396 R, 396 ML, 252.1, 492.2, 442.11, 250/398; 427/523; 438/527; 315/111.81; 118/729, 722
See application file for complete search history.

(56) References Cited

U.S. PATENT DOCUMENTS

| 4,922,106 | A  | 5/1990  | Berrian et al.   |
| 6,750,462 | B2 | 6/2004  | Iwasawa et al.   |
| 2004/0232350 | A1 | 11/2004 | Iwasawa et al. |
| 2005/0184254 | A1 | 8/2005  | Matsumoto et al. |
| 2006/0057303 | A1 | 3/2006  | Agarwal et al. |
| 2006/0240651 | A1 | 10/2006 | Renau et al.   |

FOREIGN PATENT DOCUMENTS

| EP | 1580789 A2 | 9/2005 |
| WO | 9908306 A1 | 2/1999 |

*Primary Examiner*—Jack I Berman
*Assistant Examiner*—Meenakshi Sahul (57) ABSTRACT

A method includes receiving an input signal representative of a desired two-dimensional non-uniform dose pattern for a front surface of a workpiece, driving the workpiece relative to an ion beam to distribute the ion beam across the front surface of the workpiece, and controlling at least one parameter of an ion implanter when the ion beam is incident on the front surface of the workpiece to directly create the desired two-dimensional non-uniform dose pattern in one pass of the front surface of workpiece relative to the ion beam. The beam may be a scanned beam or a ribbon beam. An ion implanter is also provided.

12 Claims, 9 Drawing Sheets

FIG. 13 ed States Patent
NON-UNIFORM ION IMPLANTATION

FIELD

This invention relates to ion implantation and, more particularly, to non-uniform ion implantation.

BACKGROUND

Ion implantation is a standard technique for introducing conductivity—altering impurities into a workpiece such as a semiconductor wafer. A desired impurity material may be ionized in an ion source, the ions may be accelerated to form an ion beam of prescribed energy, and the ion beam may be directed at a front surface of the wafer. The energetic ions in the beam penetrate into the bulk of the semiconductor material and are embedded into the crystalline lattice of the semiconductor material to form a region of desired conductivity. The ion beam may be distributed over the wafer area by beam movement, wafer movement, or by any combination thereof.

Traditionally, ion implanters strive to introduce the impurities at a uniform dose across the front surface of the wafer and lack the ability to provide a non-uniform dose pattern. Dose is usually measured in a number of implanted ions per unit area. However, there have been recent trends towards providing a non-uniform dose pattern. A non-uniform dose pattern may be utilized to mitigate the effect of spatial variation in one or more other process steps during semiconductor device manufacturing. For example, the impact of non-uniform etch patterns may be at least partially compensated for by altering the implant dose with an inverse spatial variation.

To create a desired non-uniform dose pattern, one conventional ion implanter may utilize a hard mask to block the ion beam in specified areas from striking the wafer. Other conventional ion implanters may limit wafer movement and/or beam scanning to effectively limit the ion beam to specified areas. Multiple passes of the ion beam relative to the front surface of the wafer can then create uniform but different doses in different regions. Drawbacks of these approaches include the additional time for multiple passes which adversely affects throughput performance. In addition, the actual implanted non-uniform dose pattern may not accurately match the desired non-uniform dose pattern since the desired dose pattern can only be approximated with multiple passes of different uniform doses in different regions.

Another conventional ion implanter having a scanned ion beam creates a non-uniform dose pattern by defining and controlling the scan velocity of the scanned ion beam in one scanned direction. However, the defined scan velocity of the beam in the scanned direction is not modified as the wafer is driven in a direction orthogonal to the scanned direction. Accordingly, one pass of the wafer through the scanned beam is made, the wafer is rotated, and an additional pass is made, and so on. A drawback of this approach is that it requires multiple passes of the wafer relative to the ion beam which adversely affects throughput performance. It also requires the wafer to be rotated before each pass and the resulting dose pattern is largely limited to symmetrical patterns.

Accordingly, there is a need for new and improved methods and apparatus for directly creating a desired two-dimensional non-uniform dose pattern.

SUMMARY

According to a first aspect of the invention, a method is provided. The method includes receiving an input signal representative of a desired two-dimensional non-uniform dose pattern for a front surface of a workpiece, driving the workpiece relative to an ion beam to distribute the ion beam across the front surface of the workpiece, and controlling at least one parameter of an ion implanter when the ion beam is incident on the front surface of the workpiece to directly create the desired two-dimensional non-uniform dose pattern in one pass of the front surface of workpiece relative to the ion beam.

According to another aspect of the invention, a machine readable medium is provided. The machine readable medium contains instructions that when executed by a processor result in the following: receiving an input signal representative of a desired two-dimensional non-uniform dose pattern for a front surface of a workpiece; driving the workpiece relative to an ion beam to distribute the ion beam across the front surface of the workpiece; and controlling at least one parameter of an ion implanter when the ion beam is incident on the front surface of the workpiece to directly create the desired two-dimensional non-uniform dose According to yet another aspect of the invention, an ion implanter is provided. The ion implanter includes an ion beam generator configured to generate an ion beam and direct the ion beam to a front surface of a workpiece. The ion implanter also includes a drive mechanism to drive the workpiece relative to the ion beam to distribute the ion beam across the front surface of the workpiece. The ion implanter also includes a controller configured to receive an input signal representative of a desired two-dimensional non-uniform dose pattern for the front surface of the workpiece and to control at least one parameter of the ion implanter when the ion beam is incident on the front surface of the workpiece to directly create the desired two-dimensional non-uniform dose pattern in one pass of the front surface of workpiece relative to the ion beam.

BRIEF DESCRIPTION OF THE DRAWINGS

For a better understanding of the present invention, reference is made to the accompanying drawings, which are incorporated herein by reference and in which.

DETAILED DESCRIPTION

The invention is described herein in connection with an ion implanter. However, the invention can be used with other systems and processes that use beams of energetic charged particles. Thus, the invention is not limited to the specific embodiments described below.

Figure 1:
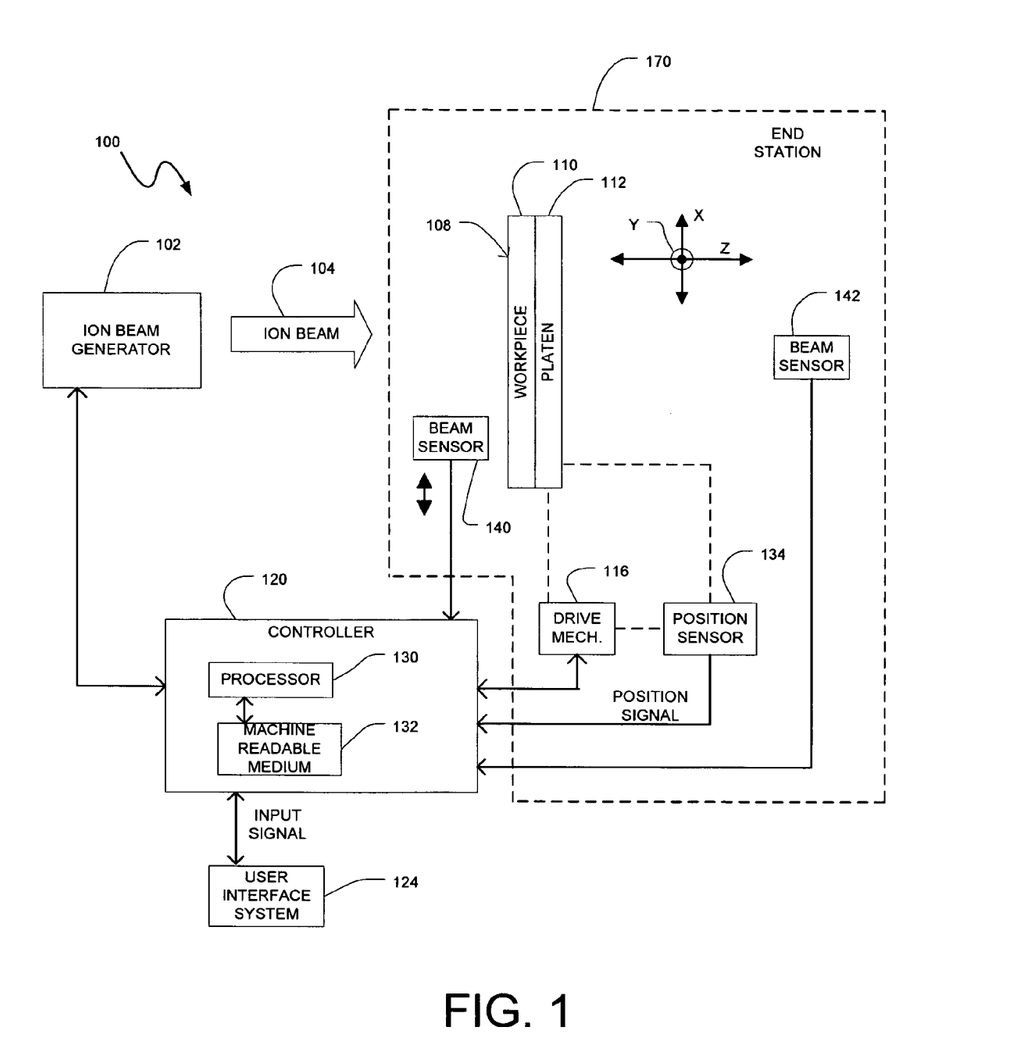
FIG. 1 is a schematic block diagram of an ion implanter including a controller in accordance with the invention.

FIG. 1 illustrates a block diagram of an ion implanter 100 including an ion beam generator 102, an end station 170, and a controller 120 consistent with an embodiment of the invention. The ion beam generator 102 may generate an ion beam 104 and direct it towards a front surface 108 of a workpiece 110. The ion beam 104 may be distributed over the front surface of the workpiece 110 by beam movement, workpiece movement, or by any combination thereof.

The ion beam generator 102 can include various types of components and systems to generate the ion beam 104 having desired characteristics. The ion beam 104 may be a spot beam or a ribbon beam. The spot beam may have an irregular cross-sectional shape that may be approximately circular in one instance. The spot beam may be a fixed or stationary spot beam without a scanner. Alternatively, the spot beam may be scanned by a scanner for providing a scanned ion beam. The ribbon beam may have a large width/height aspect ratio and may be at least as wide as the workpiece 110. The ion beam 104 can be any type of charged particle beam, such as an energetic ion beam used to implant the workpiece 110.

The end station 170 may support one or more workpieces in the path of the ion beam 104 such that ions of the desired species are implanted into the workpiece 110. The workpiece 110 may be supported by the platen 112 and clamped to the platen 112 by known techniques such as electrostatic wafer clamping. The workpiece 110 can take various physical shapes such as a common disk shape. The workpiece 110 can be a semiconductor wafer fabricated from any type of semiconductor material such as silicon or any other material that is to be implanted using the ion beam 104.

The end station 170 may include a workpiece drive system (not illustrated) to physically move the workpiece 110 to and from the platen 112 from holding areas. The end station 170 may also include a drive mechanism 116 to drive the platen 112 and hence the workpiece 110 clamped to the platen 112 in a desired way. The drive mechanism 116 may include servo drive motors, screw drive mechanisms, mechanical linkages, and any other components as are known in the art to drive the workpiece 110 when clamped to the platen 112.

The end station 170 may also include a position sensor 134, which may be further coupled to the drive mechanism 116, to provide a sensor signal representative of the position of the workpiece 110 relative to the ion beam 104. Although illustrated as a separate component, the position sensor 134 may be part of other systems such as the drive mechanism 116 and the position sensor may be any type of position sensor known in the art such as a position-encoding device. The position signal from the position sensor 134 may be provided to the controller 120.

The end station 170 may also include various beam sensors to sense the beam current density of the ion beam at various locations such as a beam sensor 140 upstream from the workpiece 110 and a beam sensor 142 downstream from the workpiece. As used herein, "upstream" and "downstream" are referenced in the direction of ion beam transport or the Z direction as defined by the X-Y-Z coordinate system of FIG. 1. Each beam sensor 140, 142 may contain a plurality of beam current sensors such as Faraday cups arranged to sense a beam current density distribution in a particular direction. The beam sensors 140, 142 may be driven in the X direction and placed in the beam line as needed.

The controller 120 may receive input data and instructions from any variety of systems and components of the ion implanter 100 and provide output signals to control the components of the ion implanter 100. The controller 120 can be or include a general-purpose computer or network of general-purpose computers that may be programmed to perform desired input/output functions. The controller 120 may include a processor 130 and a machine readable medium 132. The processor 130 may include one or more processors known in the art such as those commercially available from Intel Corporation. The machine readable medium 132 may include on or more machine readable storage media such as random-access memory (RAM), dynamic RAM (DRAM), magnetic disk (e.g., floppy disk and hard drive), optical disk (e.g., CD-ROM), and/or any other device that can store instructions for execution. The controller 120 can also include other electronic circuitry or components, such as application specific integrated circuits, other hardwired or programmable electronic devices, discrete element circuits, etc. The controller 120 may also include communication devices.

A user interface system 124 may include, but not be limited to, devices such as touch screens, keyboards, user pointing devices, displays, printers, etc. to allow a user to input commands and/or data and/or to monitor the ion implanter 100 via the controller 120.

The controller 120 may be configured to receive an input signal representative of a desired two-dimensional non-uniform dose pattern for the front surface 108 of the workpiece 110. In one instance, the input signal may depend on selections made by a user via the user interface 124 regarding the particulars of the desired dose pattern. In other instance, another system or component may provide the input signal based on anticipated or measured spatial variations of other process steps during semiconductor device manufacturing. In response to the input signal representative of the desired two-dimensional non-uniform dose pattern, the controller 120 may control at least one parameter of the ion beam generator 102 when the ion beam 104 is incident on the front surface 108 of the workpiece 110 to directly create the desired two-dimensional non-uniform dose pattern in one pass of the front surface 108 of the workpiece 110 relative to the ion beam 104.

Figure 2:
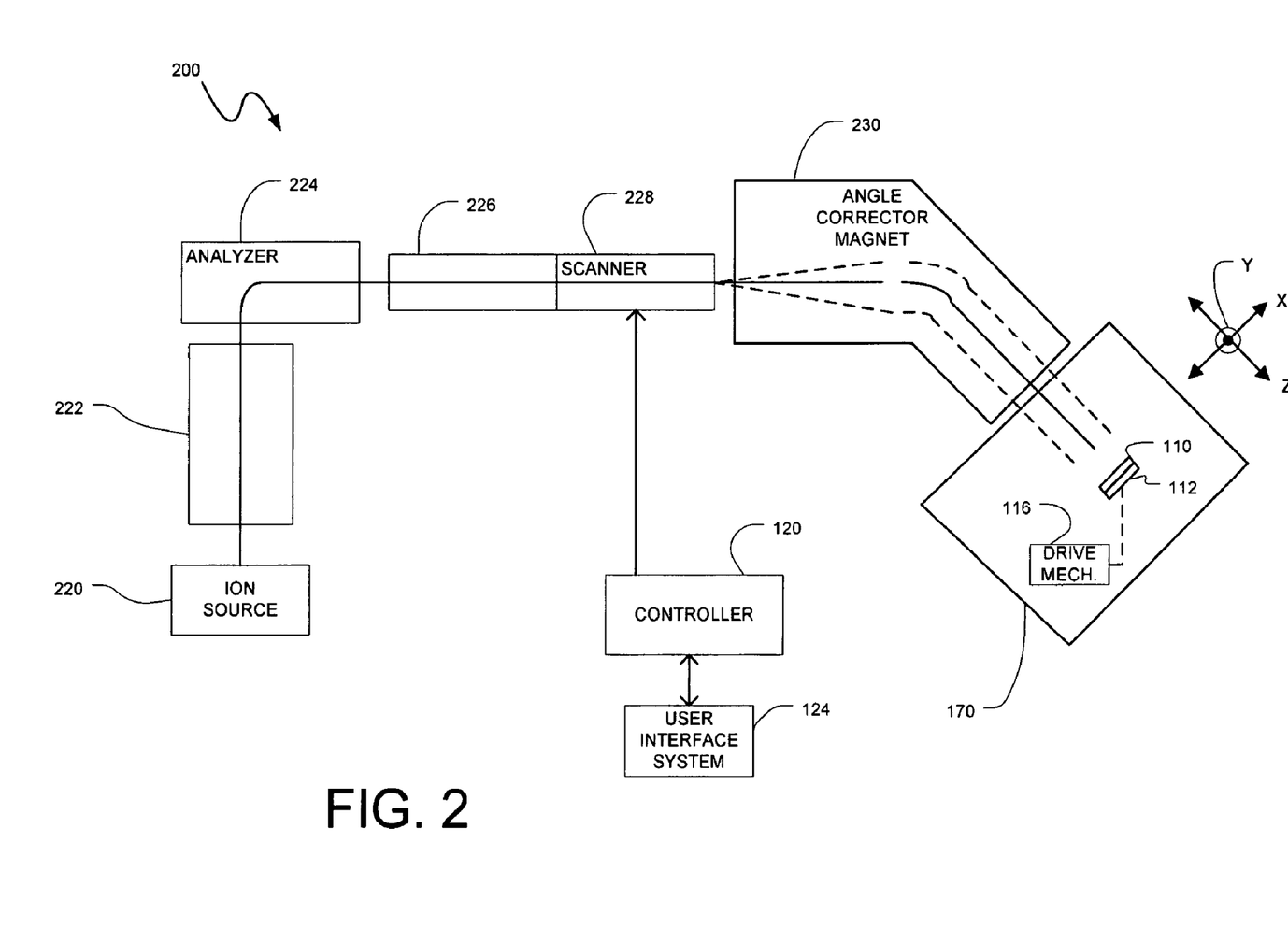
FIG. 2 is a block diagram of one embodiment of an ion implanter having a scanner to provide a scanned ion beam.

Turning to FIG. 2, a block diagram of one embodiment of an ion implanter 200 including the controller 120 in accordance with the invention is illustrated. Many other ion implanters will be known to those skilled in the art and the embodiment of FIG. 2 is provided by way of example only and is not intended to be limiting. The ion implanter 200 may include an ion source 220, an extraction electrode 222, a mass analyzer 224, a resolving aperture 226, a scanner 228, and an angle corrector magnet 230. Other components of FIG. 2 similar to components of FIG. 1 are similarly labeled and hence any repetitive description is omitted herein for clarity. For clarity of illustration, the controller 120 is illustrated as providing only an output signal to the scanner 228. Those skilled in the art will recognize that the controller 120 may provide output signals to each component of the ion implanter 200 and receive input signals from at least the same.

The ion source 220 may generate ions and may include an ion chamber and a gas box containing a gas to be ionized. The gas may be supplied to the ion chamber where it is to be ionized. The ions thus formed may be extracted from the ion source 220. The extraction electrode 222 and an extraction power supply may accelerate ions from the ion source. The extraction power supply may be adjustable as controlled by the controller 120. The construction and operation of ion sources are well known to those skilled in the art.

The mass analyzer 224 may include a resolving magnet that deflect ions so that ions of a desired species pass through the resolving aperture 226 and undesired species do not pass through the resolving aperture 226. In one embodiment, the mass analyzer 224 may deflect ions of the desired species by 90 degrees. A scanner 228 positioned downstream from the resolving aperture 226 may include scanning electrodes as well as other electrodes for scanning the ion beam. The scanner 228 may include an electrostatic scanner or a magnetic scanner. The scanner 228 is not required for other ion implanters using a ribbon beam. The angle corrector magnet 230 deflects ions of the desired ion species to convert a diverging ion beam to a nearly collimated ion beam having substantial parallel ion trajectories. In one embodiment, the angle corrector magnet 230 may deflect ions of the desired ion species by 70 degrees.

The scanner 228 may scan the ion beam in one direction and the drive mechanism 116 may physically drive the workpiece 110 in a direction orthogonal to the scan direction to distribute the scanned ion beam 104 over the front surface 108 of the workpiece 110. In one example, the scan direction may be in the horizontal X direction while the drive mechanism 116 may drive the wafer vertically in the Y direction as those X and Y directions are defined by the coordinate system of FIG. 2.

Another ion implanter embodiment may generate a stationary or fixed spot beam (e.g., without a scanner 224) and the drive mechanism 116 may drive the workpiece 110 in the X and Y directions to distribute the ion beam across the front surface 108 of the workpiece 110. Yet another ion implanter embodiment may generate a ribbon beam having a large width/height aspect ratio with a width at least as wide as the workpiece 110. The drive mechanism 116 may then drive the workpiece in a direction orthogonal to the width of the ribbon beam to distribute the ion beam across the front surface of the workpiece 110.

Figure 3:
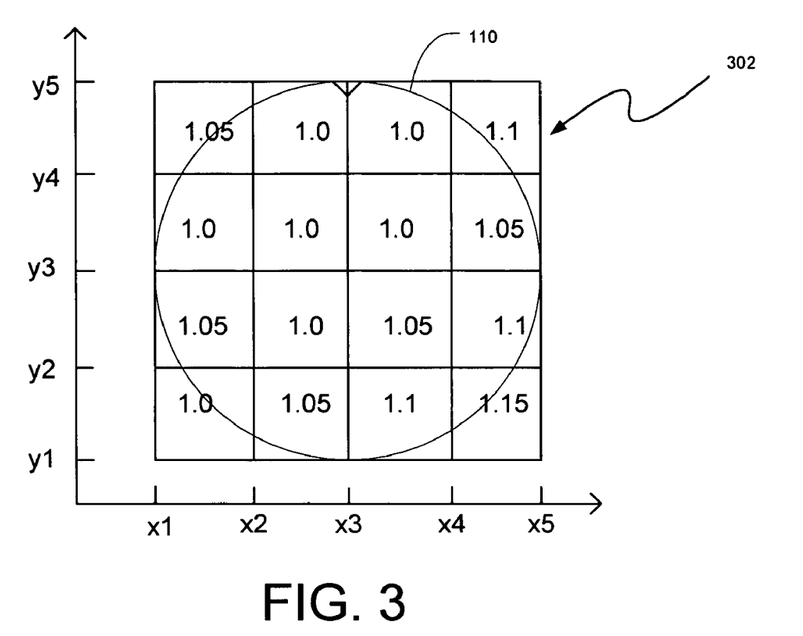
FIG. 3 is a view of a desired two-dimensional non-uniform dose pattern for a front surface of the workpiece of FIG. 1.

Turning to FIG. 3, a view of a desired two-dimensional non-uniform dose pattern 302 for a front surface 108 of the workpiece 110 of FIG. 1 is illustrated. The controller 120 may enable a user, via the user interface 124, to input a desired two-dimensional non-uniform dose pattern. The controller 120 may then define the two-dimensional non-uniform desired dose pattern 302 by a plurality of coordinates including, but not limited to, Cartesian coordinates and Polar coordinates. The pattern 302 is a simplified pattern having 16 different regions defined by associated Cartesian coordinates. The number in each region represents a multiplier for a nominal dose that would normally provide a uniform dose across the workpiece 110. For example, the number 1.05 in the region defined by X coordinates x1 and x2 and Y coordinates y4 and y5 indicates a 1.05 multiplier. The desired two-dimensional non-uniform dose pattern 302 may be an arbitrary pattern that is not limited to symmetrical patterns.

In response to the desired two-dimensional non-uniform dose pattern 302, the controller 120 may then control at least one parameter of the ion implanter when the ion beam 104 in incident on the front surface 108 of the workpiece 110 to directly create the two-dimensional non-uniform dose pattern 302 in one pass of the front surface of the workpiece relative to the ion beam. Which parameter to control may depend on the type of ion beam generated by a particular ion implanter and the way in which that ion beam is distributed across the front surface of the workpiece 110. For instance, the controllable parameter may be the scan velocity for a scanned ion beam or may be the beam current density for a ribbon beam. Such parameters may be adjusted in response to a uniformity tuning procedure of the ion implanter.

Figure 4:
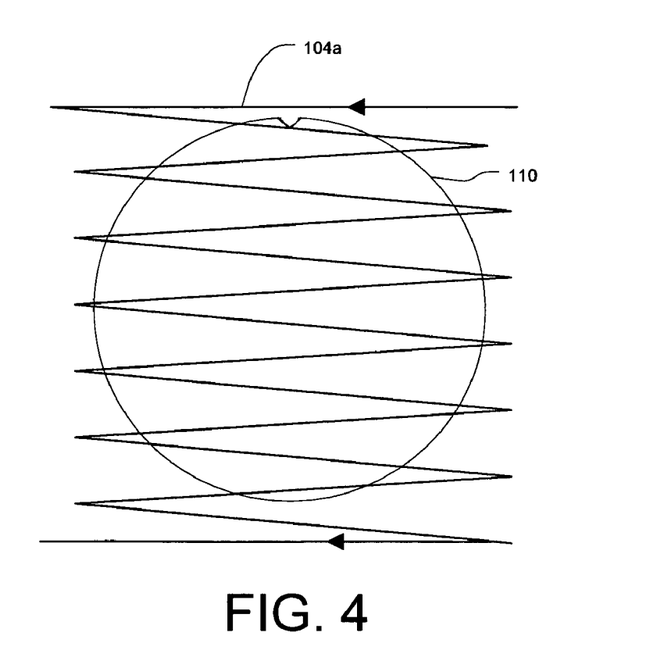
FIG. 4 is a schematic representation of one scan pattern on the workpiece of FIG. 2.

Turning to FIG. 4, a schematic representation of a scan pattern of a scanned ion beam 104a that may be provided by the ion implanter 200 of FIG. 2 is illustrated. In this instance, the scan direction is in the horizontal X direction while the drive mechanism 116 drives the workpiece 110 vertically in the Y direction at a constant speed. The dose rate at each position on the workpiece may be a function of the beam scan velocity or slew rate (e.g., sometimes expressed in millimeters per microsecond or mm/μs). The scan velocity versus position is often called a "microslope." These microslopes are normally adjusted by uniformity tuning procedures to provide a uniform dose.

Figure 5:
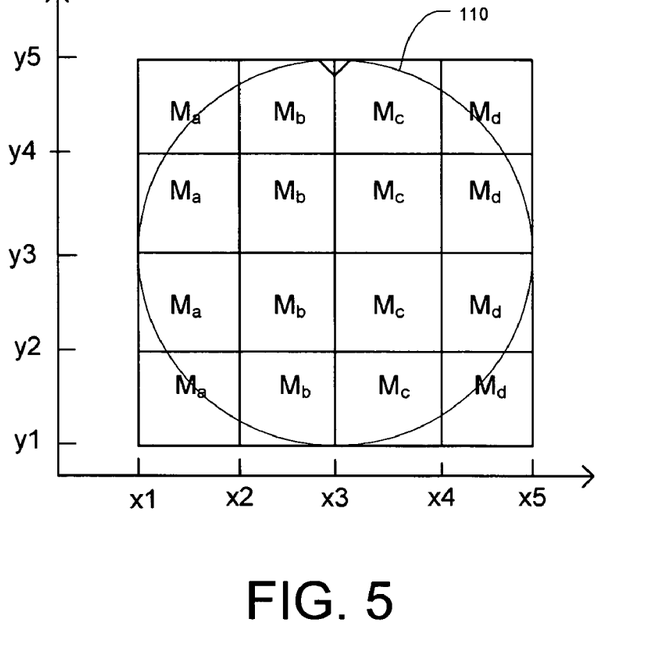
FIG. 5 is a map of microslopes associated with a normal uniformity tuning of the ion implanter of FIG. 2 to achieve a uniform dose distribution.

FIG. 5 illustrates a map of microslopes associated with a normal uniformity tuning of the ion implanter of FIG. 2 to achieve a uniform dose distribution across the workpiece 110. For example, different mircoslopes $M_a$, $M_b$, $M_c$, and $M_d$ in the differing regions may result in a uniform dose across the workpiece 110. These microslopes $M_a$, $M_b$, $M_c$, and $M_d$ may be different since the relationship between scan velocity and dose rate is not necessarily linear.

Figure 6:
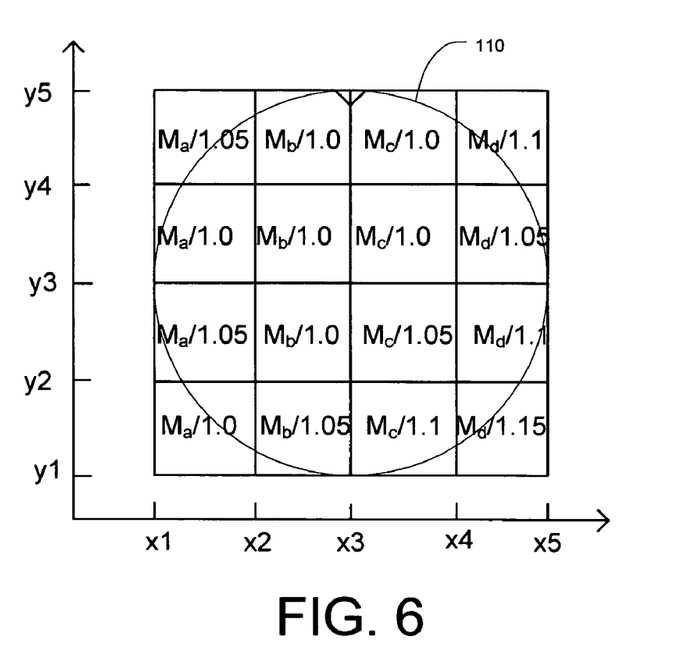
FIG. 6 is a map of initial microslopes for the desired two-dimensional non-uniform dose pattern of FIG. 3.

FIG. 6 is a map of initial microslopes for the desired two-dimensional non-uniform dose pattern of FIG. 3. As illustrated, the microslopes of FIG. 5 that result in a uniform dose are divided by their associated dose multipliers of FIG. 3 to achieve an initial desired dose in a particular region. For example, the region defined by X coordinates x1 and x2 and Y coordinates y4 and y5 has an initial microslope of $M_d/1.05$ so that the scan velocity is slowed by an associated amount in an attempt to produce a dose 1.05 times greater than what would provide a uniform dose.

Figure 7:
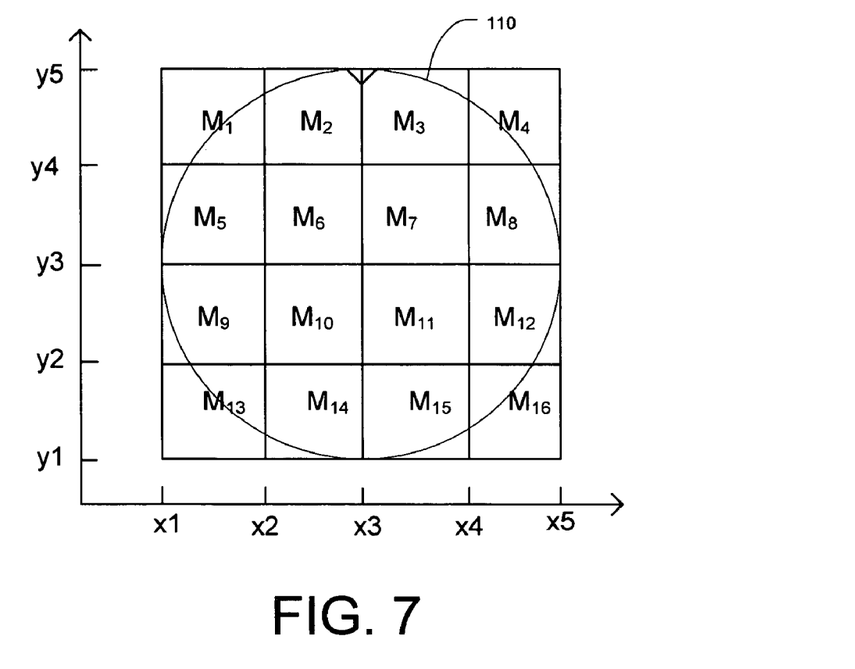
FIG. 7 is a map of final microslopes associated with a final uniformity tuning of the ion implanter of FIG. 2 to achieve the desired two-dimensional non-uniform dose pattern of FIG. 3.

FIG. 7 is a map of final microslopes $M_1$ to $M_{16}$ associated with a final uniformity tuning of the microslopes of FIG. 6 to achieve the desired two-dimensional non-uniform dose pattern of FIG. 3.

Advantageously, the desired two-dimensional non-uniform dose pattern 302 may be achieved in one pass of the ion beam relative to the front surface of the workpiece 110. This may be accomplished by altering the microslopes, and hence the scan velocities, as a function of both the horizontal and vertical position of the ion beam relative to the workpiece. For instance, as the scanner 228 scans the ion beam in the horizontal X direction the scanner may vary the scan velocity to achieve the desired dose over the range of x coordinates for a particular y coordinate of the scanned ion beam relative to the workpiece 110. As the workpiece 110 is then moved in the Y direction the scanner 228 may modify, as necessary, the scan velocity to achieve another desired dose over the range of x coordinates for the new y coordinate and so on until the entire workpiece is driven vertically in the Y direction through the scanned ion beam. In this way, the desired two-dimensional non-uniform dose pattern may be achieved in one pass of the scanned ion beam 104a relative to the front surface 108 of the workpiece 110.

In one instance, the scan velocity may be defined by a mathematical function for a particular Y coordinate. As the workpiece 110 is then driven in the vertical Y direction to another y coordinate, the mathematical function is modifiable in response to the position of the ion beam along the Y axis with respect to the workpiece 110.

Another adjustable parameter than may be combined with adjustments to the scan velocity is the velocity that the workpiece is driven in a particular direction (workpiece scan velocity) orthogonal to the scanned direction. Yet another adjustable parameter that may be combined with adjustments to the scan velocity is rotation of the workpiece about a central axis during ion implantation. Such additional adjustments may provide for a broader range of operation.

Figure 8:
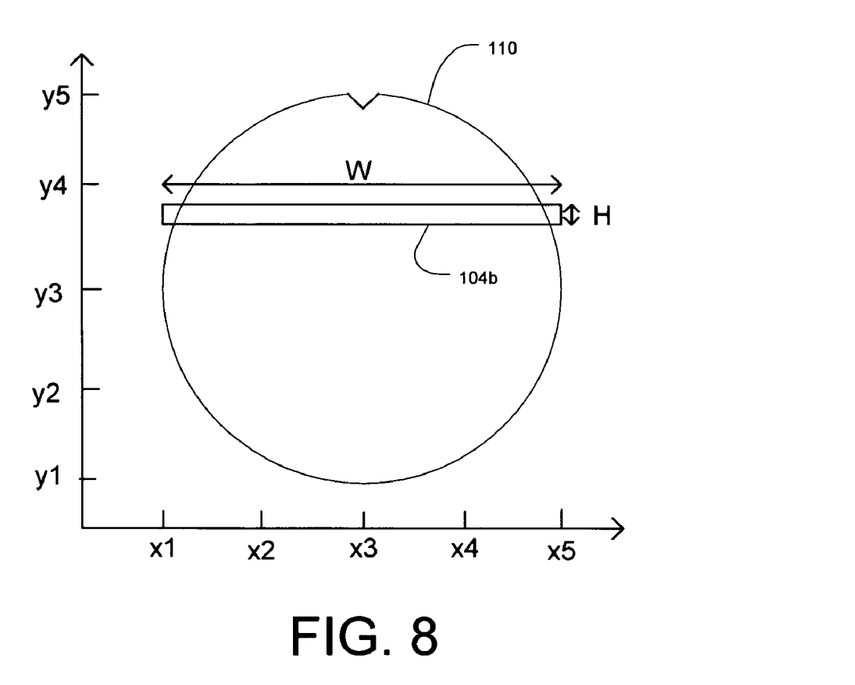
FIG. 8 is a schematic representation of a ribbon beam incident on the workpiece of FIG. 1.

Turning to FIG. 8, a schematic representation of a ribbon beam 104b having a large width (W) to height (H) aspect ratio incident on the workpiece 110 is illustrated. The long dimension (W) of the ribbon beam 104b may be at least as wide as the widest part of the workpiece 110. The ribbon beam 104b may also have its long dimension (W) oriented in the X direction and the workpiece 110 may be driven by the drive mechanism 116 in the vertical Y direction to distribute the ribbon beam 104b across the entire surface of the wafer.

Figure 9:
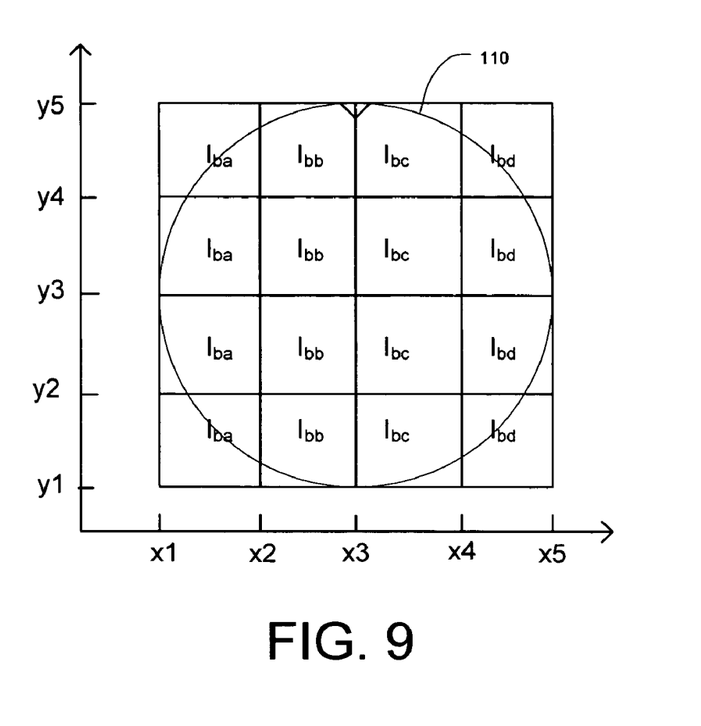
FIG. 9 is a map of beam current density of the ribbon beam associated with a normal uniformity tuning of the ion implanter of FIG. 1 to achieve a uniform dose distribution.

FIG. 9 illustrates a map of ion beam current density values associated with a normal uniformity tuning of an ion implanter generating a ribbon beam 104b to achieve a uniform dose distribution across the workpiece 110. For example, ion beam current density values $I_{ba}$, $I_{bb}$, $I_{bc}$, and $I_{bd}$ in the differing regions may result in a uniform dose across the workpiece 110. These beam current density values $I_{ba}$, $I_{bb}$, $I_{bc}$, and $I_{bd}$ may be different since the relationship between beam current density and dose rate is not necessarily linear.

Figure 10:
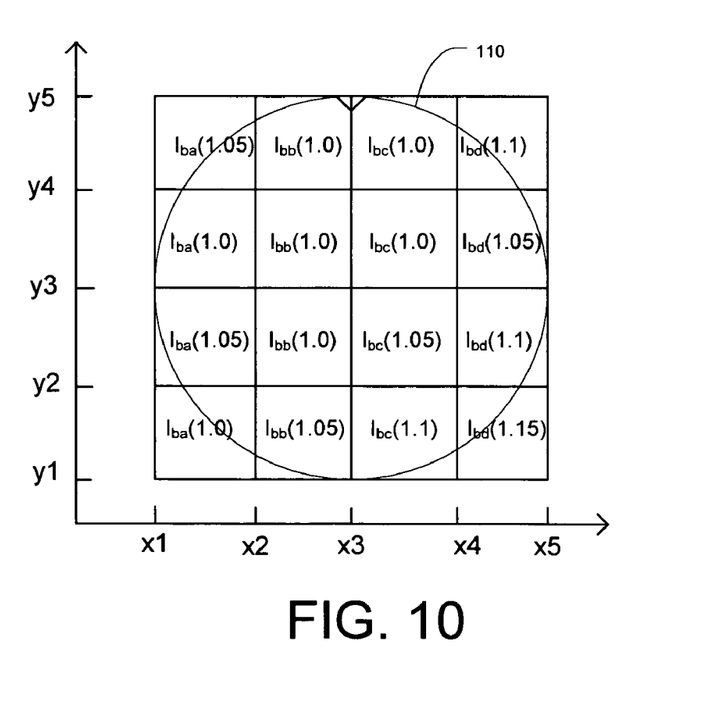
FIG. 10 is a map of initial beam currents for the desired two-dimensional non-uniform dose pattern of FIG. 3.

FIG. 10 is a map of initial beam current density values for the desired two-dimensional non-uniform dose pattern of FIG. 3. As illustrated, the beam current density values of FIG. 9 that result in a uniform dose are multiplied by their associated dose multipliers of FIG. 3 to achieve an initial desired dose in a particular region. For example, the region defined by X coordinates x1 and x2 and Y coordinates y4 and y5 has an initial beam current density of $I_{ba}(1.05)$ so that the beam current density is increased by 5% in this region in an attempt to produce a dose 1.05 times greater than that that would provide a uniform dose.

Figure 11:
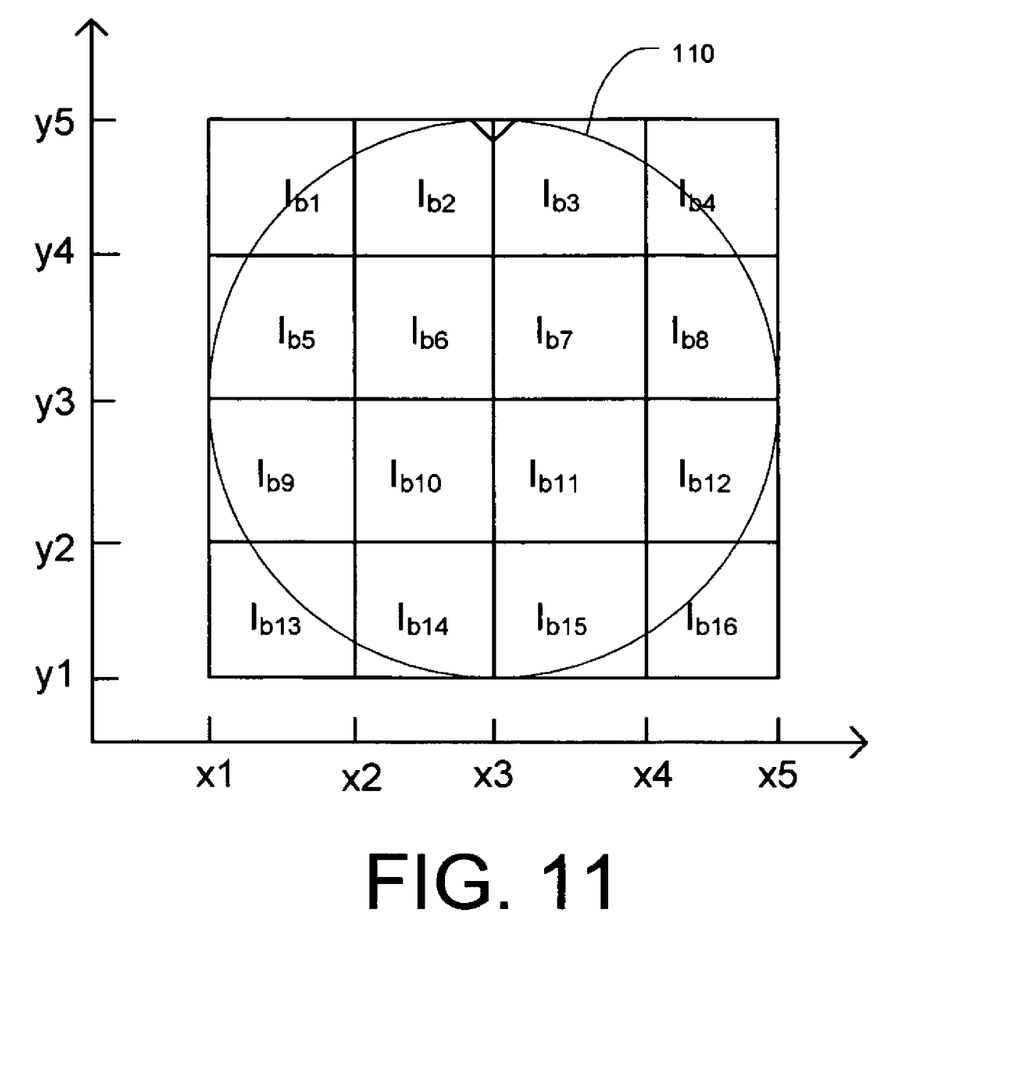
FIG. 11 is a map of final beam currents associated with a final uniformity tuning of the ion implanter of FIG. 1 to achieve the desired two-dimensional non-uniform dose pattern of FIG. 3.

FIG. 11 is a map of final beam current densities $I_{b1}$ to $I_{b16}$ associated with a final uniformity tuning of the beam currents of FIG. 10 to achieve the desired two-dimensional non-uniform dose pattern of FIG. 3.

Figure 12:
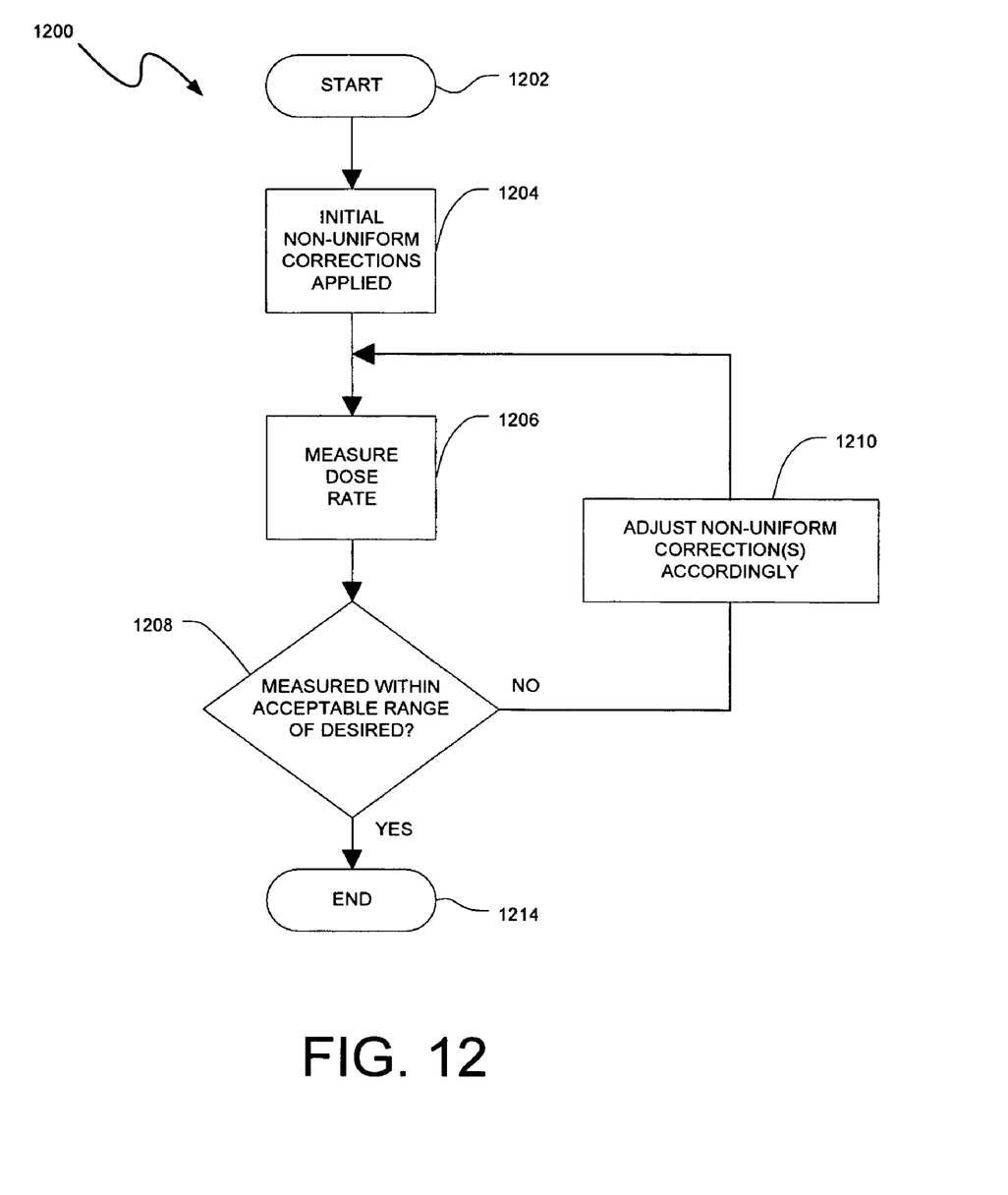
FIG. 12 is a flow chart of iterative tuning operations to achieve the desired two-dimensional non-uniform dose pattern of FIG. 3.

FIG. 12 is a flow chart of operations 1200 to further illustrate the iterative process of tuning to achieve the desired two-dimensional non-uniform dose pattern of FIG. 3. As the tuning process is started 1202, initial non-uniform corrections are applied 1204 to the results of the uniformity tuning process. For example, the initial non-uniform corrections may include those corrections of FIG. 6 or FIG. 9 resulting in an initial non-uniform dose. The dose rate may then be measured 1206 and operation 1208 may determine whether the measured dose rate is within an acceptable range of the desired dose rate. If it is, the final uniformity tuning is complete 1214 and the final non-uniform corrections may be applied as an implant is made to a workpiece. If it is not, the uniformity tuning process adjusts the non-uniform correction or corrections accordingly 1210 to correct for the measured discrepancies and measures the dose rate again 1206. This iterative process of adjustments and measurements may continue and take several iterations until the latest adjustment results in satisfactory measured dose rates.

The final non-uniform corrections, e.g., of FIGS. 7 and 11, may then be applied as an implant is made to a workpiece to achieve the desired two-dimensional non-uniform dose pattern of FIG. 3 in one pass of the front surface of the workpiece relative to the ion beam. The final non-uniform corrections may deviate, even substantially, from the initial non-uniform corrections. For scanned beams, one reason for the deviation may be due to transmission efficiency variations of the scanned beam across the width of the scanned beam. For example, the scanned beam may have 70% transmission efficiency from the scanner to the workpiece at a left side extreme of the scan width, 85% efficiency at a center portion of the scan width, and 75% efficiency on the right side extreme of the scan width. The final uniformity tuning may therefore account for the changes in transmission efficiency as the beam is scanned across the workpiece. For a ribbon beam, one reason for the deviation between the final and initial non-uniform corrections may be that the height of the ribbon beam may not be uniform across the beam width. Hence, the measured beam current density may not be directly related to the dose rate.

Figure 13:
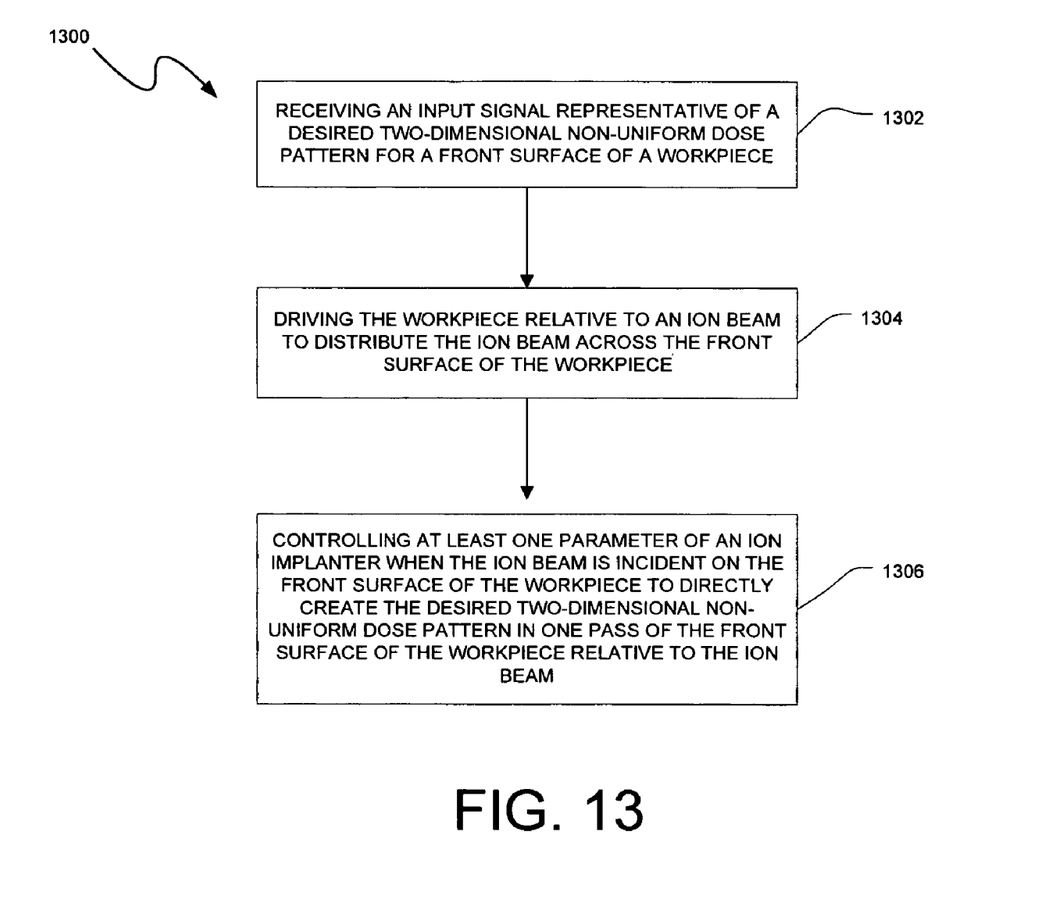
FIG. 13 is a flow chart of operations consistent with an embodiment of the invention.

Turning to FIG. 13, a flow chart 1300 of operations consistent with an embodiment of the invention is illustrated. Operation 1302 includes receiving an input signal representative of a desired two-dimensional non-uniform dose pattern for a front surface of a workpiece. Operation 1304 includes driving the workpiece relative to an ion beam to distribute the ion beam across the front surface of the workpiece. Operation 1306 includes controlling at least one parameter of an ion implanter when an ion beam is incident on the front surface of the workpiece to directly create the desired two-dimensional non-uniform dose pattern in one pass of the front surface of the workpiece relative to the ion beam.

Advantageously, at least one parameter of the ion implanter may be controlled to directly create the desired two-dimensional non-uniform dose pattern rather than trying to approximate a desired two-dimensional non-uniform dose pattern with multiple implants. In addition, since the desired two-dimensional dose pattern is directly created, arbitrary two-dimensional non-uniform dose patterns may be achieved as opposed to patterns largely limited to symmetrical patterns. Furthermore, the desired two-dimensional non-uniform dose pattern may be achieved in one pass of the workpiece relative to the ion beam as opposed to multiple passes and multiple passes combined with rotation of the workpiece between each pass. The desired two-dimensional non-uniform dose pattern may also be achieved with a scanned beam by driving the workpiece at a constant speed in a direction orthogonal to the scanned direction.

It will be appreciated that the functionality described for all the embodiments described herein may be implemented using hardware, firmware, software, or a combination thereof. When the methods detailed herein are implanted in software, instructions may be stored in a machine readable medium such a media 132 for execution by a processor such a processor 130. In other instances, the methods can be implemented in one or more programs executing on one or more programmable computers that include a processor.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the foregoing description is by way of example only and is not intended as limiting.

What is claimed is:

1. A method comprising:
   receiving an input signal representative of a desired two-dimensional non-uniform dose pattern for a front surface of a workpiece;

driving said workpiece relative to an ion beam to distribute said ion beam across said front surface of said workpiece; and controlling at least one parameter of an ion implanter when said ion beam is incident on said front surface of said workpiece to directly create said desired two-dimensional non-uniform dose pattern in one pass of said front surface of said workpiece relative to said ion beam without a second pass of said front surface of said workpiece with said ion beam.

2. The method of claim 1, further comprising scanning said ion beam to provide a scanned beam, and wherein said at least one parameter comprises a scan velocity of said scanned beam.

3. The method of claim 2, further comprising:

scanning said ion beam in a first direction;

driving said workpiece in a second direction orthogonal to said first direction at a constant speed; and modifying said scan velocity in response to a position of said scanned beam along said first and second direction relative to said front surface of said workpiece to achieve said desired two-dimensional non-uniform dose pattern in one pass of said workpiece in the second direction relative to said scanned beam.

4. The method of claim 1, wherein said ion beam comprises a ribbon beam having a long dimension, and wherein said at least one parameter comprises a beam current density of said ribbon beam.

5. The method of claim 4, further comprising:

orientating said ribbon beam with said long dimension in a first direction;

driving said workpiece in a second direction orthogonal to said first direction at a constant speed;

modifying said beam current density in response to a position along said long dimension of said ribbon beam relative to said front surface of said workpiece; and modifying said beam current density in response to a position of said ribbon beam along said second direction relative to said front surface of said workpiece to achieve said desired two-dimensional non-uniform dose pattern in one pass of said workpiece in said second direction relative to said ribbon beam.

6. The method of claim 1, further comprising defining said two-dimensional non-uniform dose pattern by a plurality of coordinates, each of said plurality of coordinates having an associated desired dose.

7. The method of claim 1, wherein said input signal is dependent on selections of a user regarding said desired two-dimensional non-uniform dose pattern, and said desired two-dimensional non-uniform dose pattern comprises an arbitrary pattern.

8. A machine readable medium containing instructions that when executed by a processor result in the following:

receiving an input signal representative of a desired two-dimensional non-uniform dose pattern for a front surface of a workpiece;

driving said workpiece relative to an ion beam to distribute said ion beam across said front surface of said workpiece; and controlling at least one parameter of an ion implanter when said ion beam is incident on said front surface of said workpiece to directly create said desired two-dimensional non-uniform dose pattern in one pass of said front surface of said workpiece relative to said ion beam without a second pass of said front surface of said workpiece with said ion beam.

9. The machine readable medium of claim 8, containing instructions that when executed by said processor also result in scanning said ion beam to provide a scanned beam, and wherein said at least one parameter comprises a scan velocity of said scanned beam.

10. The machine readable medium of claim 9, containing instructions that when executed by said processor also result in scanning said ion beam in a first direction, driving said workpiece in a second direction orthogonal to said first direction at a constant speed, and modifying said scan velocity in response to a position of said scanned beam along said first and second direction relative to said front surface of said workpiece to achieve said desired two-dimensional non-uniform dose pattern in one pass of said workpiece in said second direction relative to said scanned beam.

11. The machine readable medium of claim 8, wherein said ion beam comprises a ribbon beam having a long dimension, and wherein said at least one parameter comprises a beam current density of said ribbon beam.

12. The machine readable medium of claim 11, containing instructions that when executed by said processor also result in orientating said ribbon beam with said long dimension in a first direction, driving said workpiece in a second direction orthogonal to said first direction at a constant speed, modifying said beam current density in response to a position along said long dimension of said ribbon beam relative to said front surface of said workpiece, and modifying said beam current density in response to a position of said ribbon beam along said second direction relative to said front surface of said workpiece to achieve said desired two-dimensional non-uniform dose pattern in one pass of said workpiece in said second direction relative to said ribbon beam.

\* \* \* \* \*